INVENTOR.
QUENTIN BERG
BY Whittemore, Hulbert & Belknap
ATTORNEYS

INVENTOR.
QUENTIN BERG
BY Whittemore Hulbert + Belknap
ATTORNEYS

United States Patent Office 3,429,039

Patented Feb. 25, 1969

4,429,039

APPARATUS AND METHOD FOR INSERTING GROUPS OF LEAD WIRES IN A CIRCUIT BOARD

Quentin Berg, % Berg Electronics, Inc., New Cumberland, Pa. 17070

Filed May 19, 1966, Ser. No. 551,264

U.S. Cl. 29—626 9 Claims

Int. Cl. H05k *3/32;* H01r *7/06;* B23p *19/04*

ABSTRACT OF THE DISCLOSURE

The disclosure relates to an apparatus and method for simultaneously moving a plurality of circuit elements along independent paths from a pick-up position to a position above a circuit board and then securing the elements to the circuit board.

This invention relates to an apparatus and method for attaching a plurality of circuit elements to a circuit component and has particular reference to an apparatus and method wherein a group of lead wires are stripped from a carrier, individually indexed relative to a circuit board, and then secured on the circuit board.

In the electronics industry it is often necessary to secure a number of lead or jumper wires of different lengths or gauges to a circuit component or board. Conventionally these lead wires are manually secured to the circuit board. Each type of lead wire is manufactured as a loose part and is stored in a bin adjacent the work area. The technician selects the appropriate lead and manually inserts or secures it to the circuit board at the appropriate location. This conventional method of attaching lead wires to circuit boards is slow, somewhat unreliable, and expensive in terms of labor costs.

The present invention provides an efficient, compact, flexible apparatus which in one cycle of operation reliably attaches a plurality of lead wires to a circuit board so that the appropriate lead wire is secured to the circuit board in the desired location. The apparatus is adaptable to attach as many as twenty or more individual lead wires to the circuit board simultaneously.

The apparatus is easily adjusted to wire different types of circuit boards where the lead wires are required to be attached to the circuit board at given positions thereon. This flexibility of operation is attained by means of a novel indexing mechanism for moving each individual lead wire from a pick-up position to a given position adjacent the circuit board. Following simultaneous indexing of the lead wires to the desired positions relative to the circuit board, the lead wires are positively secured to the circuit board to complete the cycle of operation.

Accordingly, a principal object of the invention is to provide a novel apparatus for securing a plurality of lead wires to a circuit board.

Another object of the invention is to provide an apparatus for securing circuit elements to a circuit component by simultaneously indexing each circuit element from a pick-up position to an installation position and then securing the elements to the component.

A further object of the invention is to provide a novel apparatus for indexing a circuit element relative to a circuit board.

A still further object of the invention is to provide a novel method of securing lead wires to a circuit board.

Other objects and features of the invention will become apparent as the description proceeds, especially when taken in conjunction with the accompanying drawings illustrating a preferred embodiment of the invention, wherein.

THE APPARATUS

Figures 1, 2, 9, 10:
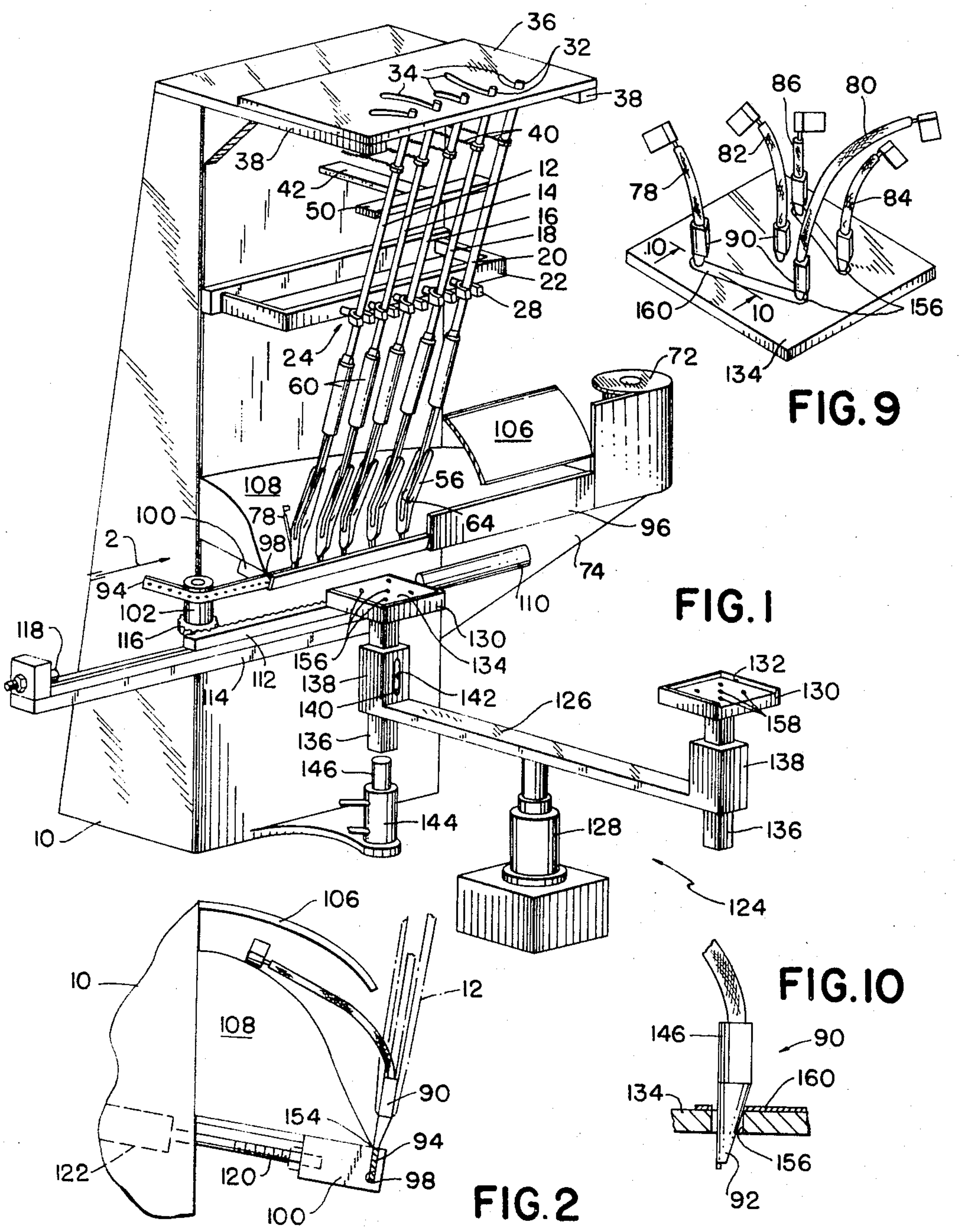
FIGURE 1 is a perspective view of an apparatus according to the invention.
FIGURE 2 is a partially broken away side view taken in the direction of the arrow 2 in FIGURE 1.
FIGURE 9 is a perspective view of a circuit board after lead wires have been attached thereto by the apparatus.
FIGURE 10 is a sectional view taken along line 10—10 of FIGURE 9.
Figures 3, 4, 5, 6, 7, 8:
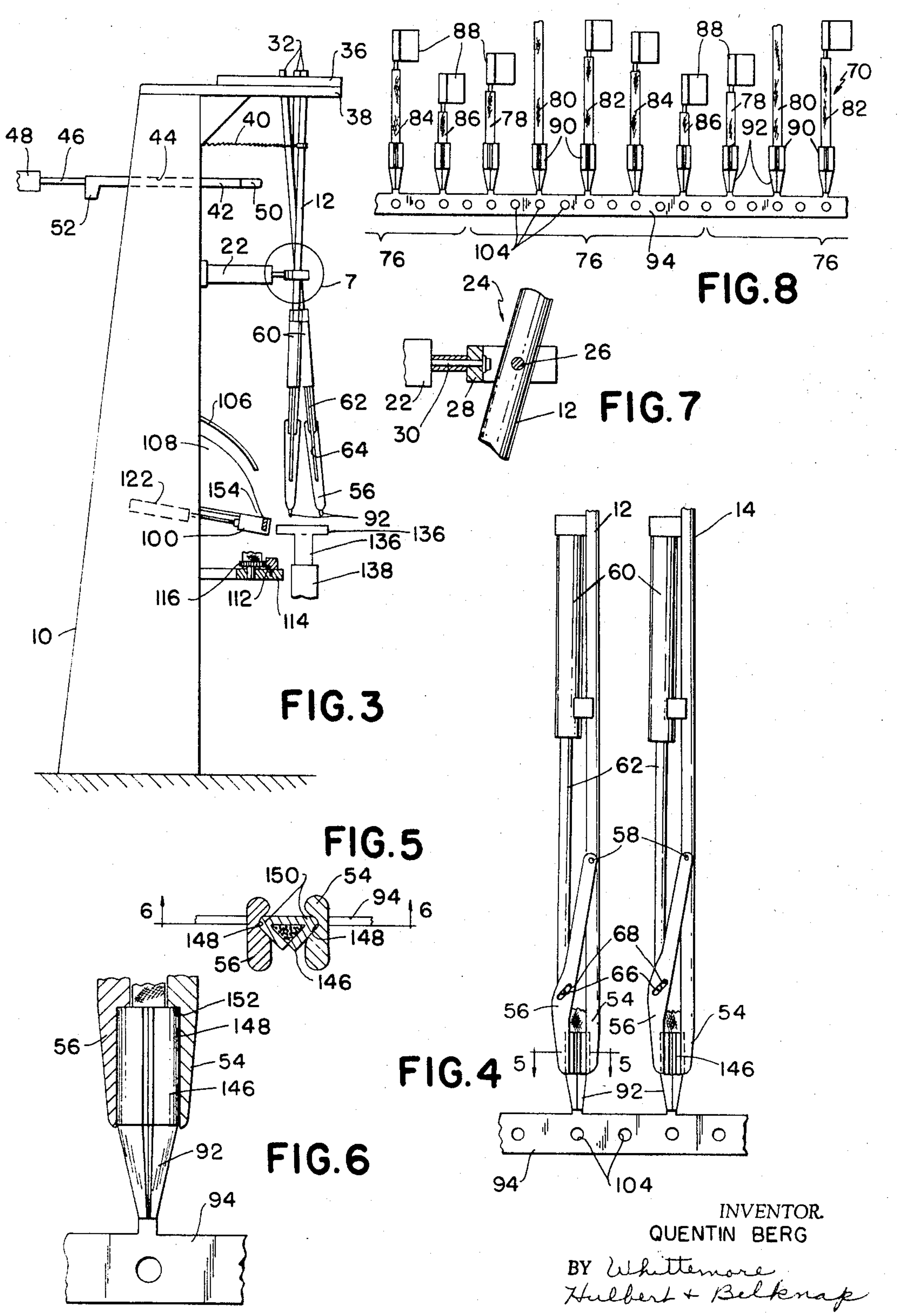
FIGURE 3 is a side view of the apparatus shown in FIGURE 1.
FIGURE 4 is a view of two lead wire gripping arms.
FIGURE 5 is a sectional view taken along line 5—5 of FIGURE 4.
FIGURE 6 is a sectional view taken along line 6—6 of FIGURE 5.
FIGURE 7 is an enlarged partially broken away view of that portion of FIGURE 3 within circle 7.
FIGURE 8 shows a portion of the lead wire assembly used by the apparatus described herein.

FIGURES 1 and 3 shows an apparatus according to the invention including an upstanding base 10 with indexing arms 12, 14, 16, 18 and 20 pivotally mounted on bracket 22 carried by the base.

As shown in FIGURE 7, each indexing arm 12–20 is attached to the bracket 22 by a pivot 24 so as to allow for universal rotation of the arms relative to the base. Each arm is freely pivoted about a pin 26 which extends between the arms of the U-shaped pivot member 28. Member 28 is in turn journaled on pin 30 which secures the universal pivot 24 to the bracket 22 so as to allow for universal movement of the indexing arm.

The upper ends 32 of the indexing arms 12–20 extend through slots 34 in control plate 36 which is supported by brackets 38 on base 10 above the universal arm pivots 24. Coil springs 40 extend between the base 10 and the upper end 32 of each indexing arm so as to bias the arms toward the inner ends of slots 34 located closest to the base 10.

The body portion of T-shaped guide bar 42 is reciprocally confined within slot 44 extending through base 10 and is attached to the piston rod 46 of air cylinder 48. When the air cylinder 48 is extended, the bar 42 is moved outwardly through base 10 so that portion 50 thereof engages the arms 12–20 so as to move the arms along slots 34 and rotate them about the universal pivots 24 until the ends 32 of the arms abut the outer ends of slots 34. Bar 42 carries a stop 52 to limit outward movement thereof. It should be noted that the outer ends of grooves 34 lie in a line parallel to a line joining the pivot points of the arms 12–20 so that when the bar 42 is extended as shown in FIGURE 1, the arms 12–20 are parallel and lie in the same plane.

As best shown in FIGURE 4, the lower portion of each indexing arm 12–20 includes a fixed jaw member 54 and a movable jaw member 56 which is pivoted to the arm at a point 58 located above the fixed jaw 54. Each indexing arm carries a small air cylinder 60 located above the pivot point 58. Piston rod 62 of air cylinder 60 extends into a central groove 64 in movable jaw 56 and carries a cam pin 66 extending through slots 68 in each side of the movable jaw. The air cylinders 60 are provided with suitable air lines (not shown) so that the jaws 54, 56 of each of the indexing arms 12–20 may be simultaneously opened or closed by extending or retracting piston rods 62.

A length of the lead wire assembly 70 as shown in FIGURE 8 is wound on reel 72 mounted to one side of the base 10 on a bracket 74. The lead wire assembly 70 is made up of a number of like groups 76 of parallel lead wires arranged serially along the length of the assembly 70. Each of these groups 76 includes a number of individual lead wires 78, 80, 82, 84 and 86 which may have different wire lengths and gauges, depending upon the requirements of the circuit board assembly. In the lead wire assembly 70 a suitable flag type disconnect 88 is attached to the upper end of each of the lead wires 78–86. The lower end of each of the lead wires is secured to a contact terminal 90 having a tapered lower portion 92 suitable for engagement in a contact opening in a circuit board as illustrated in FIGURES 9 and 10. In the assembly 70 the terminals 90 are each secured to a carrier strip 94 which runs the length of the assembly and serves to orient the individual lead wires in the desired transverse and parallel position.

The lead wire assembly 70 is wound on reel 72 with the carrier strip 94 at the bottom of the reel and the individual lead wires extending upwardly therefrom. Strip 94 as illustrated in FIGURE 1 is led from reel 72 through guide 96, slot 98 in cut-off holder 100, and around capstan drive 102 located on the opposite side of the base 10 from reel 72. The capstan drive 102 engages holes 104 in the carrier strip 94 so that when the drive is rotated, the lead wire assembly 70 is fed from reel 72 toward the indexing arms 12–20. As the assembly 70 is unwound from reel 72, the lead wires 78–86 are confined between shield 106 and guide 108 so that they do not interfere with the operation of the apparatus.

The capstan drive 102 is actuated by means of an air cylinder 110 mounted on base 10 which drives rack 112 along guide 114. Rack 112 engages pinion gear 116 on the capstan drive 102 so that with each drive stroke of air piston 110 the drive 102 is rotated through an angle sufficient to position a group 76 of lead wires in the pick-up position located adjacent the gripping jaws of the indexing arms 12–20. The capstan drive 102 is provided with a one-way clutch to prevent reverse rotation of the drive during the return stroke of the air cylinder 110. The stroke of the rack 112 is determined by an adjustable stop 118 carried at the outer end of guide 114. By appropriate adjustment of stop 118 the angle of rotation of the capstan drive 102 may be adjusted so that with each feed stroke of the air cylinder 110 a new group of lead wires 76 is brought into the pick-up position with each of the lead wires 78–86 located immediately adjacent the jaw end of one of the indexing arms 12–20.

As illustrated best in FIGURE 2, the cut-off holder 100 is tilted slightly so that the carrier strip slot 98 therein is oriented in alignment with the indexing arms 12–20 when they are positioned in the pick-up position with the upper ends 32 thereof held against the outer ends of slots 34 by guide bar 42. Thus when a lead wire group 76 is indexed into the pick-up position, each contact terminal 90 carried by lead wires 78–86 is located adjacent and parallel to one of the indexing arms.

The cut-off holder 100 is slidably mounted on the bottom face of guide 108 and is also secured to piston rod 120 of air cylinder 122 so that upon actuation of the air cylinder 122 the holder 100 may be retracted a short distance toward base 10 to sever the terminals of the indexed group 76 from carrier strip 94.

A circuit board holding and indexing structure 124 is located in front of base 10 and includes a turntable 126 which is rotatably mounted in support bearing 128 so that upon rotation of the turntable 126 one of the two circuit board holders 130 may be positioned in the work position adjacent the lower end of indexing arms 12–20 as shown in FIGURE 1. Each circuit board holder 130 is provided on its upper surface with a recess 132 for confining a circuit board 134 therein. Each circuit board holder 130 is supported by a vertical bar 136 which is slidably confined within one end portion 138 of turntable 126. The movement of the rod 136 relative to the end portion 138 is limited by pin 140 carried by the rod and confined within slot 142.

An air cylinder tamper 144 is mounted on base 10 so that when one of the circuit board holders 130 is located in the work position and air cylinder 144 is actuated, piston 146 abuts the lower end of bar 136 so as to raise circuit board holder 130 above the normal work position.

OPERATION

The cycle of operation of the apparatus described in begun by actuating air cylinder 110 to move rack 112 along guide 114 and rotate capstan 102 through an angle sufficient to position a group 76 of lead wires in the pick-up position in cut-off holder 100. At this time, as shown in FIGURE 3, guide bar 42 is retracted and the indexing arms 12–20 are held against the inner ends of control slots 34 by springs 40 so that the jaws 54, 56 are located away from the lead wire assembly and do not interfere with the indexing operation. Air cylinders 60 are retracted so that the gripping jaw of each indexing arm is held open. The turntable 126 is rotated through a 180° angle to position a circuit board holder 130 in the work position adjacent the arms 12–20.

Following indexing of a lead wire group 76 to the pick-up position, the air cylinder 48 is extended to move the guide bar 42 away from base 10 and against the indexing arms 12–20 so that the upper ends 32 thereof are guided along the control slots 34 to the outer end of the slots and the open jaws 54, 56 are moved toward the base to the pick-up position where the open jaw members 54 and 56 of each indexing arm are positioned to either side of the triangular barrel portion 146 of a contact terminal 90 carried by one of the lead wires of the group 76 held in the cut-off holder 100.

Air cylinders 60 are then actuated to close the jaws 54, 56 of each of the indexing arms 12–20 so that each arm grips one of the terminals 90 in the group 76 as shown in FIGURES 1, 4, 5 and 6. The holding faces of the jaws 54 and 56 are provided with axial grooves 148 which grip corners 150 of the terminal barrel portion 146 to prevent lateral movement of the terminal relative to the closed jaws. The upper ends of grooves 148 form shoulders 152 which fit over the top of the barrel portion 146 at the corners 150 to prevent axial movement of the terminal 90 relative to the gripping jaws. When the jaws 54, 56 are closed over the terminals 90, air pressure may be maintained in air cylinders 60 so that the jaws continue to be urged toward the closed position so as to grip the terminals tightly and prevent accidental dropping of the lead wires from the indexing arms. As best shown in FIGURE 6, the jaws 54 and 56 grip only the upper portion 146 of the terminal 90 so that the tapered lower portion 92 is free and extends downwardly away from the jaws.

After the terminals 90 are held by the indexing arms, the air cylinder 122 is retracted so as to move the cut-off holder 100 under the leading edge 154 of guide 108 so as to sever the held terminals 90 from the carrier strip 94. Following the severing step, the air cylinder 122 may be extended to move the cut-off holder back to the normal position as illustrated in FIGURES 2 and 3. The lead wires 78, 80, 82, 84 and 86 are now held solely by indexing arms 12, 14, 16, 18 and 20 respectively with the wire portions thereof confined between the shield 106 and guide 108.

Air cylinder 48 is now retracted to move guide bar 42 back toward base 10 so that each indexing arm will be moved back under the influence of one of the springs 40 until the upper portion thereof is seated against the inner end of one of the control slots 34 as illustrated in FIGURE 3. The control slots 34 on plate 36 are curved and generally diverge so that upon retraction of guide bar 42 the lead wires held in the indexing arm jaws are moved away from the pick-up position to a predetermined position above the circuit board 134 held in the circuit board holder 130 adjacent the apparatus.

With the upper portions 32 of the indexing arms seated in the ends of the slots 34 nearest the base 10 the terminals 90 held by the gripping jaws are each positioned immediately above a preformed terminal opening 156 in the circuit board. The geometry of the control slots 34 is such that the indexing arms are smoothly pivoted about the universal pivots 24 so as to position each terminal 90 in the desired location above one of the holes 156 in the circuit board. The slots 34 are shaped so as to avoid any entanglement of the indexing arms or lead wires carried thereby during the movement from the pick-up position to the inserting position where the terminals are positioned immediately above the circuit board.

With the terminals 90 positioned immediately above the circuit board in alignment with the holes 156 formed therein and tightly held between jaws 54, 56 the tamping air cylinder 144 is actuated to raise the rod 136 and circuit board holder 130 so that the lower portions 92 of terminals 90 are securely wedged into holes 156. The circuit board holder 130 is provided with a number of relief holes 158 located immediately below holes 156 in the circuit board to assure that during the wedging step the lower terminal portion 92 is tightly wedged in the circuit board and does not strike the face of the circuit board holder 130.

After the terminals 90 have been wedged in the circuit board 134, the indexing arm jaws 54, 56 are opened by retracting air cylinders 60 and the air cylinder 144 is retracted to allow the circuit board holder to return to normal position wherein the pin 140 rests in the bottom of the slot 142. The return motion of the circuit board holder moves the lead wires now secured to the circuit board down and away from the indexing arm jaws to prevent entanglement therewith. The cycle of operation of the apparatus may be completed by rotating the turntable 126 through 180° to position a new circuit board adjacent the pick-up area and to move the circuit board with the lead wires attached thereto to a remote area where it may be removed from holder 130.

With each cycle of operation of the apparatus the lead wires making up a group 76 are attached to a circuit board 134 as illustrated in FIGURE 9. Each of the terminals 90 is tightly wedged in an opening 156 so that when the circuit board is solder dipped, the solder will flow by capillary action between the lower terminal portion 92 and the hole 156 to establish a positive electrical connection between the terminal and the printed circuitry 160 carried by the circuit board.

The pivot points of the universal joints 24 are located above the center of the circuit board 130 when it is in the work position so that the deviation from the vertical of the indexing arms when they hold the terminals 90 in position to be wedged in the circuit board is at a minimum. The taper of the lower portion 92 of terminals 90 assures that the terminals are properly seated in the holes 156 to make a proper physical contact with the circuit board despite the slight variance of the indexing arms from the perpendicular relative to the circuit board.

In order to assure that the physical contact between the terminal 90 and the circuit board is reliably made, it is desirable that each terminal be pushed into opening 156 with a force of from fifteen to twenty pounds. It is evident that the terminal 90 must be securely held in the gripping jaws by grooves 148 and shoulders 152 so that upon application of the relatively high insertion force by air cylinder 144, the terminal is wedged in a circuit board opening and not dislodged from between the gripping jaws 54 and 56. In this regard it is desirable to use a terminal 90 having a triangular cross section as illustrated in FIGURE 5 so that the corner portions 150 thereof provide positive seats for engagement with shoulders 152 to prevent axial slipping of the terminal in the jaws.

It is contemplated that the apparatus will be provided with a number of micro switches and solenoid controlled air valves so that once the operator inserts a circuit board in the circuit board holder 130 remote from the apparatus and triggers a start switch, the entire cycle of operation will proceed automatically until a circuit board with leads attached therein as shown in FIGURE 9 is presented to the operator for removal from the holder. By use of such an apparatus the time required to wire a circuit board is materially reduced from that required in the conventional hand wiring method. With the machine as described it is possible to wire a circuit board with as many as twenty or more lead wires in a very few seconds with a very high degree of reliability.

Although the invention has been described with particular reference to the wiring of circuit boards with lead wires, it is clear that the invention may be useful in securing any type of circuit element to a circuit board or the like. It is also contemplated that the invention may be adapted to secure various types of circuit elements, such as lead wires, capacitors, transistors, etc. to a circuit board in one cycle of operation. The use of an apparatus as described is not limited to the electronics industry, and may have great utility wherever it is desired to accurately index one or a number of work pieces from a pick-up position to work position where a further step is performed.

While I have illustrated and described a preferred embodiment of my invention, it is understood that this is capable of modification and I therefore do not wish to be limited to the precise details set forth but desire to avail myself of such changes and alterations as fall within the purview of the following claims.

What I claim as my invention is:

1. Apparatus for inserting a group of circuit elements in a circuit board, said circuit elements being secured to a carrier strip, comprising means for intermitently advancing the carrier strip to position a group of circuit elements in a pick-up position, support means for positioning a circuit board adjacent said group of circuit elements, a plurality of movable gripping members each having gripping means thereon adapted to grip one of the circuit elements of said group, means for separating the circuit elements from said carrier strip, means for simultaneously moving each of said gripping members along a different path from said pick-up position to a predetermined position opposite an opening in said circuit board, and means for effecting relative movement of said support means and said gripping members toward each other to insert the circuit elements in said circuit board.

2. Apparatus as in claim 1 wherein said gripping members each comprise an elongated arm and pivot joints supporting said arms for universal movement, and control means engageable with said arms for guiding movement thereof along said predetermined paths.

3. Apparatus as in claim 2 wherein said control means comprises a plate having slots therein, each of said arms extending into one of said slots.

4. Apparatus as in claim 3 including spring means urging said arms along said slots in a direction to move said circuit elements from said pick-up position toward said circuit board.

5. Apparatus as in claim 4 including means engageable with said arms and operable for moving said arms in the opposite direction along said slots to return said arms to said pick-up position.

6. Apparatus as in claim 1 including guide means having an elongated slot therein through which said carrier strip is advanced to said pick-up position, and means for moving said guide means laterally to sever said circuit elements from said carrier strip.

7. Apparatus as in claim 2 including power operated means carried by said arms for effecting operation of said gripping means.

8. Apparatus for attaching a group of circuit elements to a circuit board comprising guide means for positioning a group of circuit elements in a pick-up position, support means for holding a circuit board adjacent said guide means, a plurality of movable gripping members each having gripping means thereon adapted to grip one of the circuit elements of said group, means for moving each of said gripping members along a different path from said pick-up position to a predetermined position relative to said circuit board, and means for attaching said circuit elements to said board.

9. The method of securing a group of circuit elements to a circuit board comprising the steps of providing an elongated carrier strip having a group of individual circuit elements secured thereto, positioning a circuit board adjacent said group of circuit elements, gripping each of the circuit elements, effecting separation of the circuit elements from the carrier strip, simultaneously indexing each circuit element along a different path away from the carrier strip to a predetermined position over the circuit board, and moving the circuit elements and circuit board relatively toward each other to seat the circuit elements on the circuit board.

References Cited

UNITED STATES PATENTS

| | | | |
|---|---|---|---|
| 2,928,165 | 3/1960 | Carlzen et al. | 29—203 X |
| 3,015,881 | 1/1962 | Helda et al. | 29—203 |
| 3,057,051 | 10/1962 | Frank et al. | 29—203 |
| 3,248,784 | 5/1966 | Voordouw | 29—203 |
| 3,257,711 | 6/1966 | Van Rijsewijk | 29—203 |
| 3,302,274 | 2/1967 | Stoltz | 29—203 |
| 3,327,375 | 6/1967 | Reijnhard et al. | 29—203 |
| 3,340,608 | 9/1967 | Blair et al. | 29—626 |

JOHN F. CAMPBELL, *Primary Examiner*.

D. C. REILEY, *Assistant Examiner*.

U.S. Cl. X.R.

29—203, 628